(12) United States Patent
Crowder

(10) Patent No.: US 6,788,719 B2
(45) Date of Patent: Sep. 7, 2004

(54) OPEN LOOP CONTROL OF SGDBR LASERS

(75) Inventor: Paul F. Crowder, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 44 days.

(21) Appl. No.: 09/895,848

(22) Filed: Jun. 29, 2001

(65) Prior Publication Data

US 2002/0075918 A1 Jun. 20, 2002

Related U.S. Application Data

(63) Continuation-in-part of application No. 09/895,303, filed on Jun. 29, 2001, and a continuation-in-part of application No. 09/895,598, filed on Jun. 29, 2001, and a continuation-in-part of application No. 09/872,438, filed on Jun. 1, 2001, and a continuation-in-part of application No. 09/848,791, filed on May 4, 2001.
(60) Provisional application No. 60/215,739, filed on Jun. 29, 2000, provisional application No. 60/215,170, filed on Jun. 29, 2000, provisional application No. 60/215,742, filed on Jun. 29, 2000, provisional application No. 60/210,612, filed on Jun. 9, 2000, provisional application No. 60/209,068, filed on Jun. 2, 2000, and provisional application No. 60/203,052, filed on May 4, 2000.

(51) Int. Cl.[7] .................................. H01S 3/10
(52) U.S. Cl. .................. 372/38.02; 372/45; 372/46; 372/29.015
(58) Field of Search ...................... 372/38.02

(56) References Cited

U.S. PATENT DOCUMENTS

| | | | | |
|---|---|---|---|---|
| 4,622,672 A | | 11/1986 | Coldren et al. | |
| 4,896,325 A | * | 1/1990 | Coldren | 372/20 |
| 5,325,392 A | * | 6/1994 | Tohmori et al. | 372/96 |
| 5,392,311 A | * | 2/1995 | Makuta | 372/96 |
| 5,579,328 A | | 11/1996 | Habel et al. | |
| 5,715,271 A | | 2/1998 | Huang et al. | |
| 6,345,135 B1 | | 2/2002 | Reid et al. | |
| 6,519,062 B1 | * | 2/2003 | Yoo | 398/49 |

FOREIGN PATENT DOCUMENTS

| | | |
|---|---|---|
| EP | 0 774 684 A2 | 5/1997 |
| EP | 0 926 789 A2 | 6/1999 |
| WO | WO 99/40654 | 8/1999 |

OTHER PUBLICATIONS

Ishii, Hiroyuki et al., "Mode Stabilization Method for Superstructure–Grating DBR Lasers", Journal of Lightwave Technology, IEEE, vol. 16, No. 3, Mar. 1, 1998, pp. 433–442, XP000751395.

Sarlet, G. et al., "Wavelength and Mode Stabilization of Widely Tunable SG–DBR and SSG–DBR Lasers", IEEE Photonics Technology Letters, IEEE, vol. 11, Nov. 1999, pp. 1351–1353, XP000893767.

* cited by examiner

Primary Examiner—Paul Ip
Assistant Examiner—Dung T Nguyen
(74) Attorney, Agent, or Firm—Gates & Cooper LLP

(57) ABSTRACT

An open loop controller for use with a sampled grating distributed Bragg reflector (SGDBR) laser is presented. The controller for provides separate inputs to the laser including a front mirror current controlling a front mirror and a back mirror current controlling a back mirror to control, as well as a phase current and a gain current. The open loop controller in accordance with the present invention further includes a lookup table generated to reflect the unique specifications of each SGDBR laser is controlled.

16 Claims, 12 Drawing Sheets

OPEN LOOP CONTROL OF SGDBR LASERS

CROSS-REFERENCE TO RELATED APPLICATIONS

This application claims the benefit under 35 U.S.C. §119 (e) of the following co-pending and commonly-assigned U.S. patent applications:

Provisional Application Serial No. 60/215,739, filed Jun. 29, 2000, by Gregory A. Fish and Larry A. Coldren, entitled "OPEN LOOP CONTROL OF SGDBR LASERS,"

Provisional Application Serial No. 60/215,170, filed Jun. 29, 2000, by Paul F. Crowder, entitled "POWER AND WAVELENGTH CONTROL OF SGDBR LASERS," and Provisional Application Serial No. 60/215,742, filed Jun. 29, 2000, by Paul F. Crowder and Larry A. Coldren, entitled "GAIN VOLTAGE CONTROL OF SGDBR LASERS," all of which applications are incorporated by reference herein.

This application is a continuation-in-part patent application of the following co-pending and commonly-assigned U.S. patent applications:

Utility application Ser. No. 09/848,791, filed May 4, 2001, by Gregory A. Fish and Larry A. Coldren, entitled "IMPROVED MIRROR AND CAVITY DESIGNS FOR SAMPLED GRATING DISTRIBUTED BRAGG REFLECTOR LASERS," now U.S. Pat. No. 6,590,924, issued Jul. 8, 2003, which claims the benefit under 35 U.S.C. §119(e) of Provisional Application Serial No. 60/203,052, filed May 4, 2000, by Gregory A. Fish and Larry A. Coldren, entitled "IMPROVED MIRROR AND CAVITY DESIGNS FOR SGDBR LASERS,"

Utility application Ser. No. 09/829,438, filed Jun. 1, 2001, by Larry A. Coldren, Gregory A. Fish, and Michael C. Larson, entitled "HIGH-POWER, MANUFACTURABLE SAMPLED GRATING DISTRIBUTED BRAGG REFLECTOR LASERS," which claims the benefit under 35 U.S.C. §119(e) of Provisional Application Serial No. 60/209,068, filed Jun. 2, 2000, by Larry A. Coldren Gregory A. Fish, and Michael C. Larson, and entitled "HIGH-POWER, MANUFACTURABLE SAMPLED-GRATING DBR LASERS,"

Utility application Ser. No. 09/879,821, filed Jun. 11, 2001, by Gregory A. Fish and Larry A. Coldren, entitled "IMPROVED, MANUFACTURABLE SAMPLED GRATING MIRRORS," which claims the benefit under 35 U.S.C. §119(e) of Provisional Application Serial No. 60/210,612, filed Jun. 9, 2000, by Gregory A. Fish and Larry A. Coldren, entitled "IMPROVED, MANUFACTURABLE SAMPLED GRATING MIRRORS,"

Utility application Ser. No. 09/895,303, filed on Jun. 29, 2001, now abandoned, by Gregory A. Fish and Larry A. Coldren, entitled "GAIN VOLTAGE CONTROL OF SGDBR LASERS," which claims the benefit under 35 U.S.C. §119(e) of Provisional Application Serial No. 60/215,742, filed Jun. 29, 2000, by Paul F. Crowder and Larry A. Coldren, entitled "GAIN VOLTAGE CONTROL OF SGDBR LASERS," and Utility application Ser. No. 09/895,598 filed on Jun. 29, 2001, by Paul F. Crowder entitled "POWER AND WAVELENGTH CONTROL OF-2-SGDBR LASERS," now U.S. Pat. No. 6,690,693, issued Feb. 10, 2004, which claims the benefit under 35 U.S.C. §119(e) of Provisional Application Serial No. 60/215, 170, filed Jun. 29, 2000, by Paul F. Crowder, entitled "POWER AND WAVELENGTH CONTROL OF SGDBR LASERS,"

all of which applications are incorporated by reference herein.

BACKGROUND OF THE INVENTION

1. Field of the Invention

The present invention relates to open loop control for semiconductor lasers, and particularly, mirror, gain and phase current control for Sampled Grating Distributed Bragg Reflector (SGDBR) semiconductor lasers.

2. Description of the Related Art

Diode lasers are being used in such applications as optical communications, sensors and computer systems. In such applications, it is very useful to employ lasers that can be easily adjusted to output frequencies across a wide wavelength range. A diode laser which can be operated at selectably variable frequencies covering a wide wavelength range, i.e. a widely tunable laser, is an invaluable tool. The number of separate channels that can utilize a given wavelength range is exceedingly limited without such a laser. Accordingly, the number of individual communications paths that can exist simultaneously in a system employing such range-limited lasers is similarly very limited. Thus, while diode lasers have provided solutions to many problems in communications, sensors and computer system designs, they have not fulfilled their potential based on the available bandwidth afforded by light-based systems. It is important that the number of channels be increased in order for optical systems to be realized for many future applications.

For a variety of applications, it is necessary to have tunable single-frequency diode lasers which can select any of a wide range of wavelengths. Such applications include sources and local oscillators in coherent lightwave communications systems, sources for other multi-channel lightwave communication systems, and sources for use in frequency modulated sensor systems. Continuous tunability is usually needed over some range of wavelengths. Continuous tuning is important for wavelength locking or stabilization with respect to some other reference, and it is desirable in certain frequency shift keying modulation schemes.

In addition, widely tunable semiconductor lasers, such as the sampled-grating distributed-Bragg-reflector (SGDBR) laser, the grating-coupled sampled-reflector (GCSR) laser, and vertical-cavity lasers with micro-mechanical moveable mirrors (VCSEL-MEMs) generally must compromise their output power in order to achieve a large tuning range. The basic function and structure of SGDBR lasers is detailed in U.S. Pat. No. 4,896,325, issued Jan. 23, 1990, to Larry A. Coldren, and entitled "MULTI-SECTION TUNABLE LASER WITH DIFFERING MULTI-ELEMENT MIRRORS", which patent is incorporated by reference herein. Designs that can provide over 40 nm of tuning range have not been able to provide much more than a couple of milliwatts of power out at the extrema of their tuning spectrum. However, current and future optical fiber communication systems as well as spectroscopic applications require output powers in excess of 10 mW over the full tuning band. Current International Telecommunication Union (ITU) bands are about 40 nm wide near 1.55 μm, and it is desired to have a single component that can cover at least this optical bandwidth. Systems that are to operate at higher bit rates will require more than 20 mW over the full ITU bands. Such powers are available from distributed feedback (DFB) lasers, but these can only be tuned by a couple of nanometers by adjusting their temperature. Thus, it is very desirable to have a source with both wide tuning range (>40 nm) and high power (>20 mW) without a significant increase in fabrication complexity over existing widely tunable designs. Furthermore, in addition to control of the output wavelength, control of the optical power output for a tunable laser is an equally important endeavor as optical power determines the potential range for the laser.

Fundamentally, maximizing the output power, while stabilizing the output power and wavelength and maximizing the side mode suppression ratio are very desirable objectives in the control of SGDBR lasers. Thus, there is a need in the art for devices and methods which maximize the power output, and stabilize power and wavelength output. The present invention meets these objectives through a novel use of open loop control.

SUMMARY OF THE INVENTION

The present invention involves the open loop control of the frequency and power output of a Sampled Grating Distributed Bragg Reflector (SGDBR) semiconductor laser. The open loop control of such SGDBR devices provides stable SGDBR laser optical power and wavelength output.

The open loop control of the present invention uses a table of voltages and current settings to control the optical output power and the output wavelength or frequency. Once the optical power and output wavelength are selected, the open loop controller of the present invention selects a set of operating currents and voltages from the table corresponding to the selected output power and output wavelength. Further, the open loop controller regulates the temperature of the SGDBR laser to a fixed, pre-selected value.

To generate the operating currents, each SGDBR laser is calibrated using a calibration routine, and each controller is programmed with the values for the corresponding laser, which then controls the laser over the lifetime of the SGDBR laser.

By properly choosing the operating currents, the current sources that deliver the currents to the SGDBR laser, and properly regulating the temperature of the SGDBR laser, the open loop controller of the present invention provides greater stability of the optical output wavelength and power over the operating lifetime, as well as providing greater stability over a wider range of ambient environmental conditions.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

1. Overview

Figure 1A:
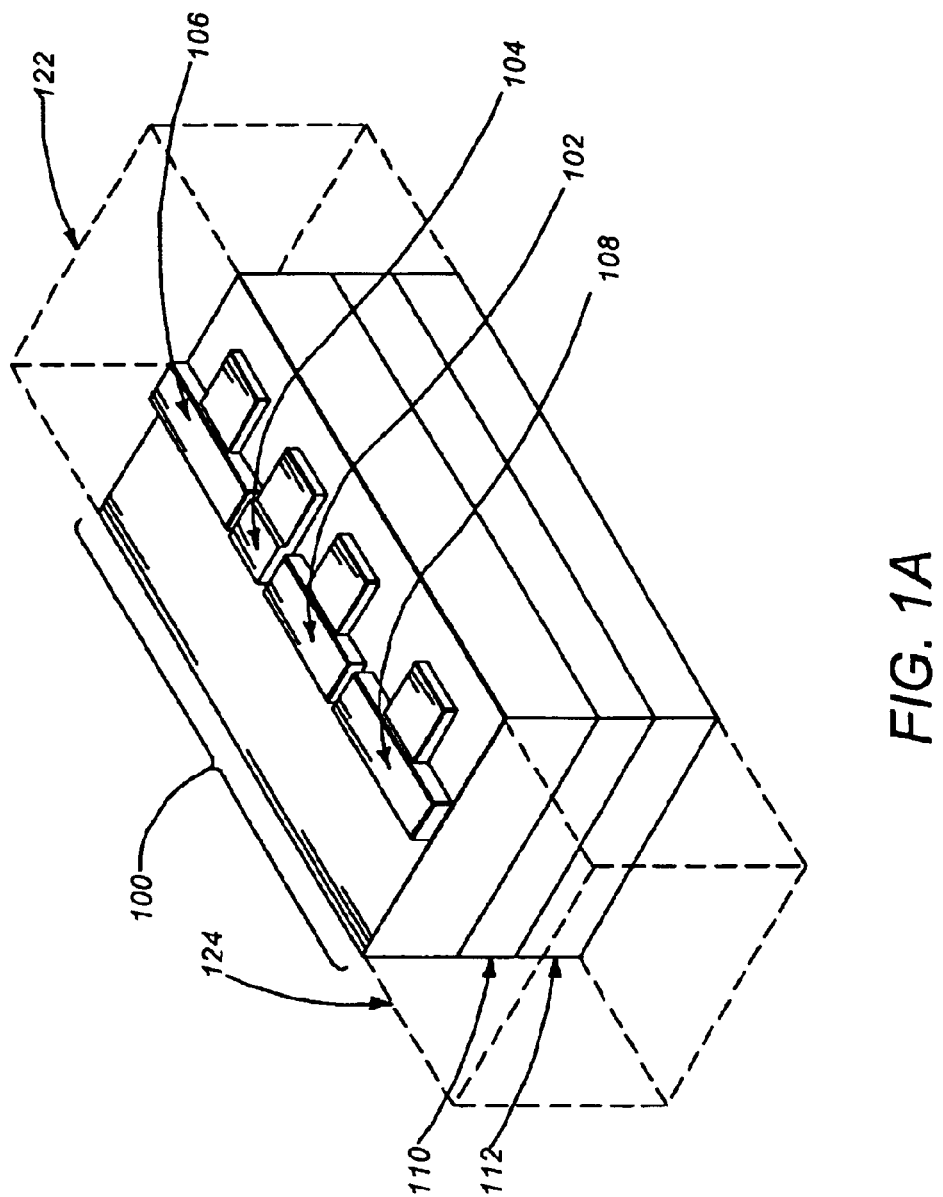
FIGS. 1A and 1B depict a typical multiple-section, widely-tunable laser as used in the invention.
Figure 1B:
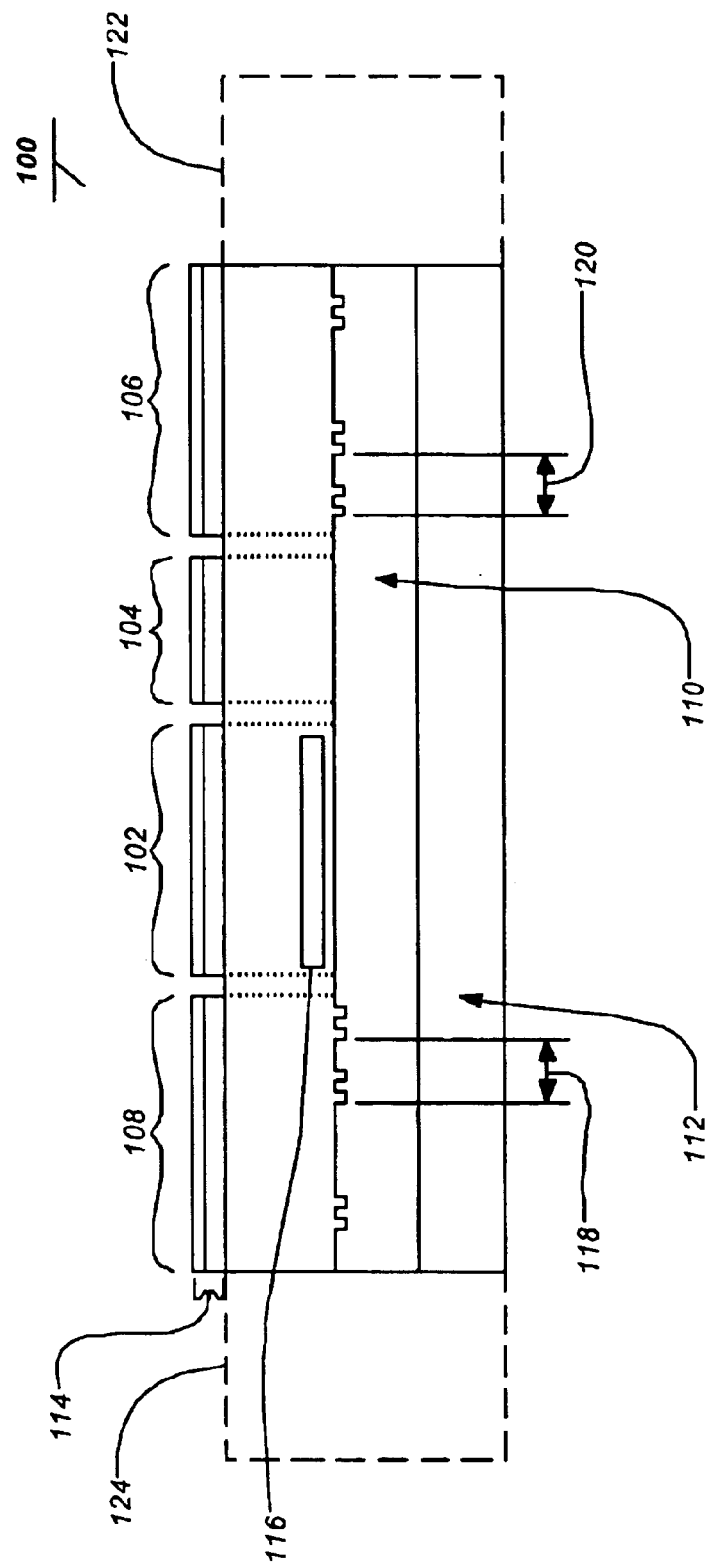

FIGS. 1A and 1B depict a typical multiple-section, widely-tunable laser 100 as used in the invention. A typical SGDBR laser 100 as used in the invention essentially comprises four sections that allow its unique tuning characteristics. The laser 100 is comprised of a gain section 102, a phase section 104, a back mirror 106 and a front mirror 108. Below these sections is a waveguide 110 for guiding and reflecting the light beam, while the entire device is formed on a substrate 112. In use, bias voltages are connected to the electrodes 114 on the top of the device and a ground is connected to a lower substrate 112. When a bias voltage on the gain section 102 is above a lasing threshold, a laser output is produced from an active region 116.

The front and back mirrors 108, 106 are typically sampled grating mirrors that respectively include different sampling periods 118, 120. The gratings behave as wavelength-selective reflectors such that partial reflections are produced at periodic wavelength spacings of an optical signal carried in the cavity. The front and back sampled grating mirrors 108, 106 together determine the wavelength with the minimum cavity loss through their effective lengths and grating differential; however, the lasing wavelength can only occur at the longitudinal modes of the optical cavity in the waveguide 110. Therefore, it is important to adjust the mirrors 106, 108 and waveguide 110 modes to coincide, thereby achieving the lowest cavity loss possible for the desired wavelength and maximum mode stability. The phase section 104 of the device shown in FIG. 1 is used to adjust the optical length of the cavity in order to position the cavity modes.

Optional back-side monitor 122 and front-side semiconductor optical amplifier (SOA) and/or optical modulator 124 sections are also indicated. Currents are applied to the various electrodes 114 of the aforementioned sections to provide a desired output optical power and wavelength as discussed in U.S. Pat. No. 4,896,325, issued Jan. 23, 1990, to Larry A. Coldren, and entitled "MULTI-SECTION TUNABLE LASER WITH DIFFERING MULTI-ELEMENT MIRRORS", which patent is incorporated by reference herein. As described therein, a current to the gain section 102 creates light and provides gain to overcome losses in the laser cavity; currents to the two differing SGDBR wavelength-selective mirrors 106, 108 are used to tune a net low-loss window across a wide wavelength range to select a given mode; and a current to the phase section 104 provides for a fine tuning of the mode wavelength. It should also be understood that the sections are somewhat interactive, so that currents to one section will have some effect on the parameters primarily controlled by the others.

Currents and voltages are applied and/or monitored at the optional sections to monitor power or wavelength, or provide amplification or modulation as specified in commonly-assigned and co-pending applications, namely application Ser. No. 09/614,378, filed on Jul. 12, 2000, by Gregory Fish et al., and entitled "OPTOELECTRONIC LASER WITH INTEGRATED MODULATOR," now U.S. Pat. No. 6,628,650, issued Sep. 30, 2003; application Ser. No. 09/614,377, filed on Jul. 12, 2000, by Larry Coldren, and entitled "INTEGRATED OPTOELECTRONIC WAVELENGTH CONVERTER," now U.S. Pat. No. 6,580,739, issued Jun. 17, 2004 and application Ser. No. 09/614,375, filed on Jul. 12, 2000, by Beck Mason et al., and entitled "TUNABLE LASER SOURCE WITH INTEGRATED OPTICAL AMPLIFIER," now U.S. Pat. No. 6,658,035, issued Dec. 23, 2003, each of which claims priority to Provisional Applications Serial Nos. 60/152,072, 60/1532,049 and 60/152,072, all filed on Sep. 2, 1999; all of which applications are incorporated by reference herein. The current invention operates under the same general principles and techniques as these background inventions.

Figure 2:
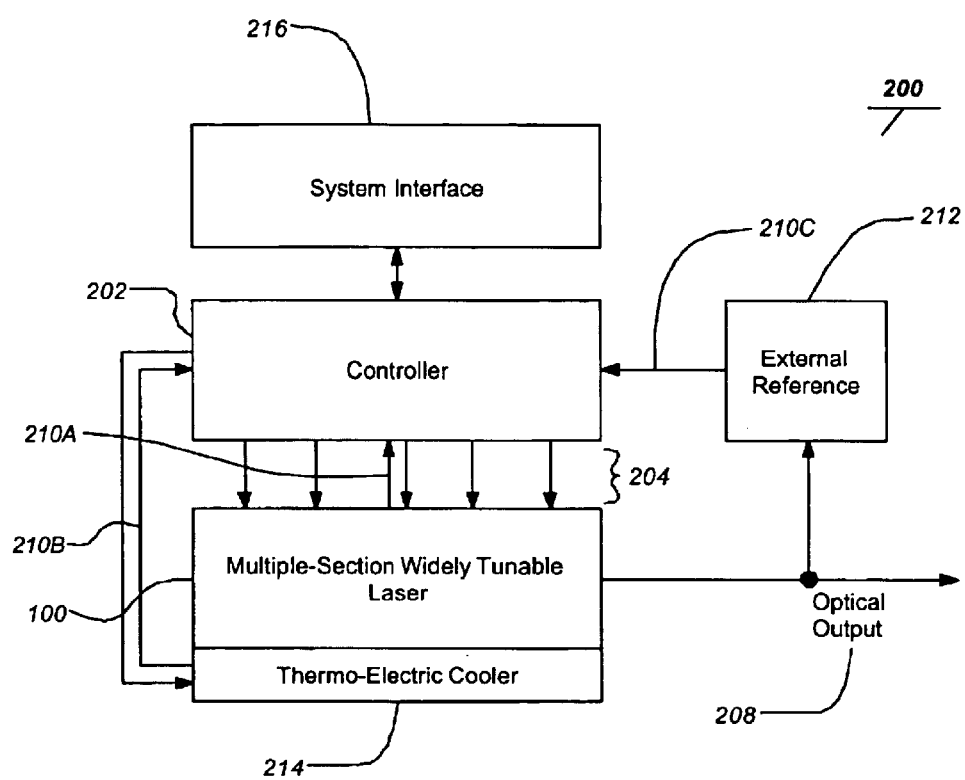
FIG. 2 is a block diagram of a typical embodiment of the invention.

FIG. 2 is a block diagram of a typical control system 200 embodiment of the invention. In general, the controller 202 applies input signals 204 to the various sections of the laser 206 to operate it and produce a laser output 208 at a desired wavelength. Many factors may influence the laser output 208 and the controller 202 optimally stabilizes the laser output 208 over the life of the laser 206. In closed-loop variants of the control system 200, the controller 202 may monitor the laser 206 and its output via feedback signals 210 and adjust the various laser inputs 204 accordingly. For example, in one embodiment the laser 206 monitors the feedback signals 210 of the multiple-section, widely tunable laser gain section voltage, temperature, and an external reference 212, such as a wavelength locker (e.g. a Fabry-Perot Etalon), via respective feedback signals 210A–210C. The controller 202 adjusts the laser section currents and temperature to maintain a fixed optical power and wavelength. The Laser temperature is regulated with a cooling device 214, such as a thermoelectric cooler (TEC), via a separate control loop. The laser 206 generates continuous optical output power.

The controller 202 interfaces to the host over a system interface 216, such as a serial or parallel interface. The host commands the operation of the controller 202. The controller 202 regulates the laser optical output power and wavelength and may operate in one of the following control modes:

A. Open loop control using fixed operating points.
B. Power and wavelength control using open loop control's fixed operating points as initial operating points and regulating the optical power and wavelength to a reference thereafter.
C. Gain voltage control using open loop controls fixed operating points as initial operating points and regulating the Laser mirror alignment with the cavity mode thereafter.
D. Regulating power, wavelength, and gain voltage using open loop control's fixed operating points as initial operating points.

Various embodiments of the control modes are detailed hereafter.

2.0 Open Loop Control

Figure 3:
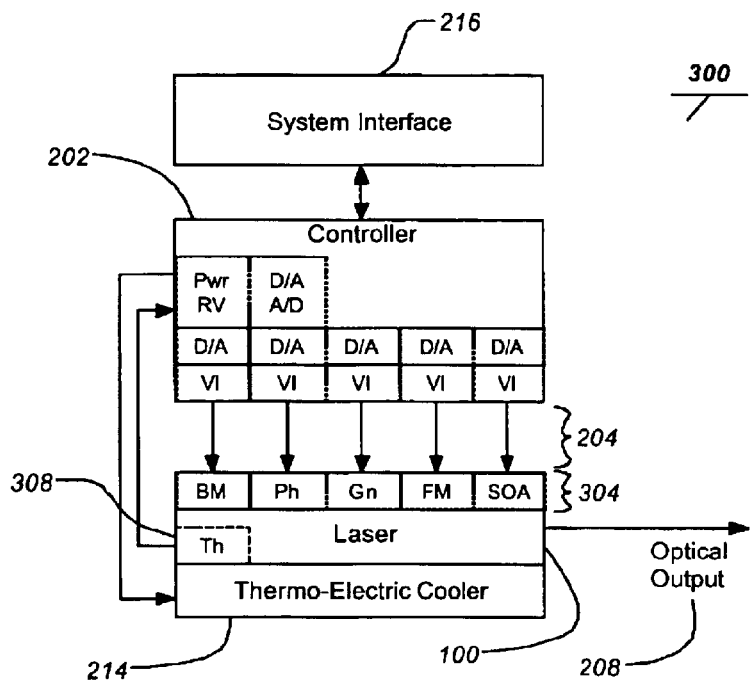
FIG. 3 illustrates an open loop control system of present invention.

FIG. 3 illustrates an open loop control system 300 that sets the laser optical output 208 power and wavelength by setting the laser section current inputs 204 from values in an aging model stored in the controller 202. The current inputs 204 may be applied, for example, to a back mirror (BM), phase (Ph), Gain (Gn), front mirror (FM), and optical amplifier (SOA) sections of the laser 304. The controller 202 regulates the laser temperature to a fixed value by monitoring a sensor 308 and controlling the cooler 214 accordingly. The current input 204 settings or operating points of the various sections of the laser 304 are generated by a calibration routine. The settings are fixed over the lifetime of the product. The choice of the operating current inputs 204, the current sources, and temperature regulator guarantees maximum stability of the optical output wavelength and power over operating lifetime and ambient environmental conditions.

As previously mentioned, the integrated optical amplifier (SOA), like the integrated modulator, is optional and not included on all designs.

2.1 Operating Points

The laser operating points are determined by either an incremental calibration routine or a mirror reflectivity peak calibration routine.

2.1.1 Incremental Calibration

Incremental calibration steps and locks the laser to each channel, such as each ITU wavelength channel using a calibrated wavelength locker as a reference, such as a Fabry-Perot etalon. It steps to the next channel by adjusting the phase current and locking the mirrors to the cavity mode with gain voltage control. Once at the channel, it locks the Laser wavelength to the channel by adjusting the phase current using wavelength control and the laser power to a predetermined set point by adjusting the gain current with power control.

Incremental calibration starts with the mirrors aligned at mirror reflectivity peak 0 and then searches for the next lower channel. At each cavity mode, it resets the phase current to its initial value and continues the search. At the end of each mirror tuning range, the mirror currents are reset to the next mirror reflectivity peak. Once the wavelength wraps around, the process is repeated at mirror reflectivity peak 0 by searching for the next upper channel.

Figure 4A:
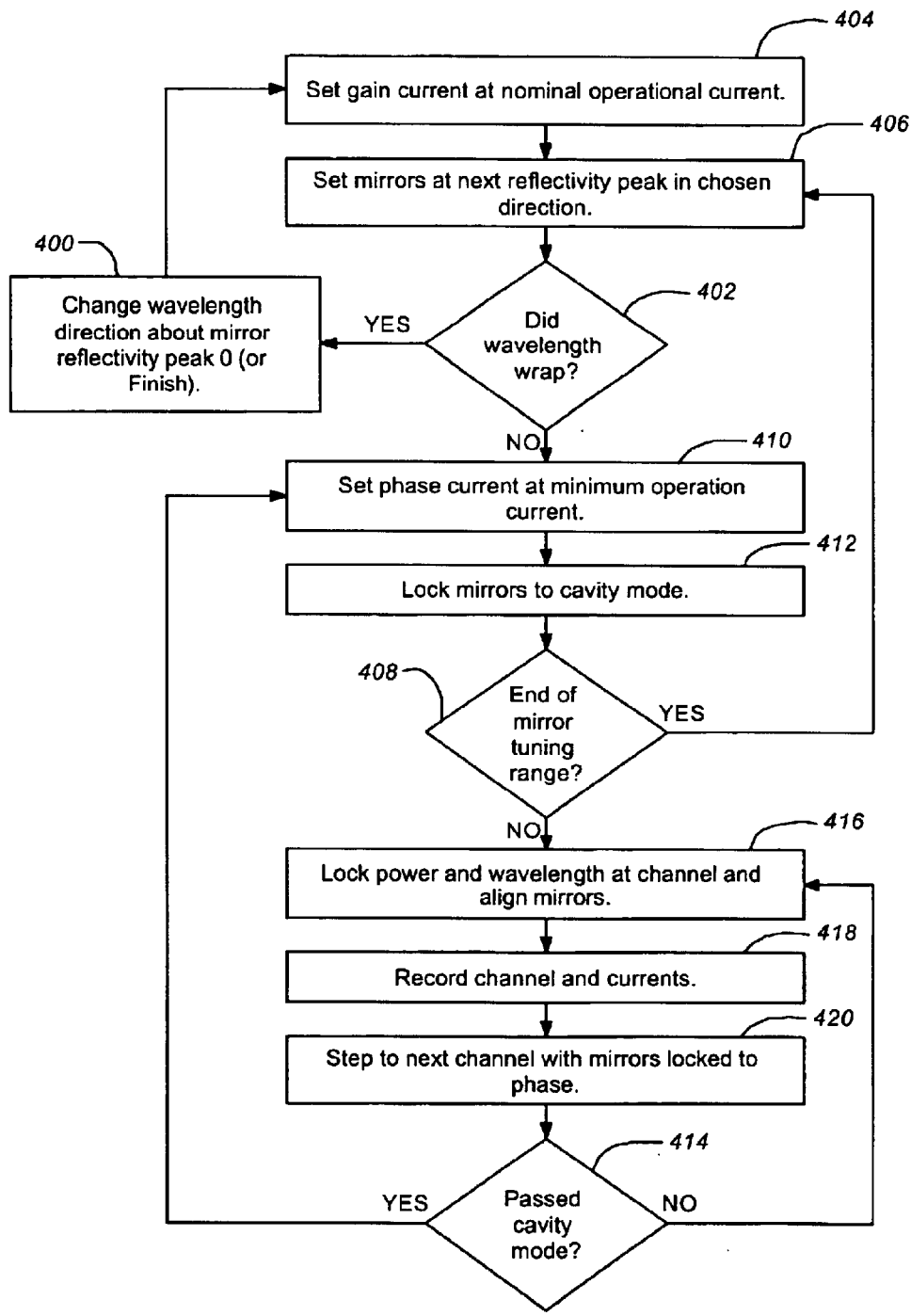
FIGS. 4A–4B ate flowcharts of the incremental and mirror reflectivity peak calibration processes.

FIG. 4A is a flowchart of the incremental calibration process. The typical process may begin by setting the gain current at a nominal operation current at block 404. The mirrors are set at the next reflectivity peak in a chosen direction (up or down) at block 406. If the wavelength wrapped at block 402, the chosen direction is changed at block 400 and the process begins again. If the wavelength did not wrap, the phase current is set at a minimum operation current at block 410 and the mirrors are locked to the cavity mode at block 412. If the mirrors have reached the end of their tuning range at block 408, the process resets to block 406 at the next reflectivity peak. If the tuning range has not been reached, the power and wavelength are locked at the channel and the mirrors are aligned at block 416. The channel and corresponding input currents are recorded at block 418 and the laser is stepped to the next channel with the mirrors lock to phase at block 420. If the cavity mode has been passed at block 414, the process restarts at block 410 to reset the phase current. If the cavity mode has not been passed, power and wavelength are locked again at the new channel as the process resets to block 416. This process will continue until a change in wavelength is indicated again at block 400. At this point, the process ends.

The following pseudo-code also describes the logic of the incremental calibration shown in FIG. 4A.

For each wavelength direction about mirror reflectivity peak 0
    Until (wavelength wraps)
        Set gain current at nominal operational current
        Set mirrors at next reflectivity peak
        Until (end of mirror tuning range)
            Set phase current at minimum operational current
            Lock mirrors to cavity mode
            Until (passes cavity mode)
                Lock power and wavelength at channel and align mirrors
                Record channel and currents
                Step to next channel with mirrors locked to phase

2.1.2 Mirror Reflectivity Peak Calibration

Mirror reflectivity peak calibration determines the mirror reflectivity peaks, generates the mirror tuning efficiency curves, and uses the curves to set the mirror currents for each channel.

Figure 4B:
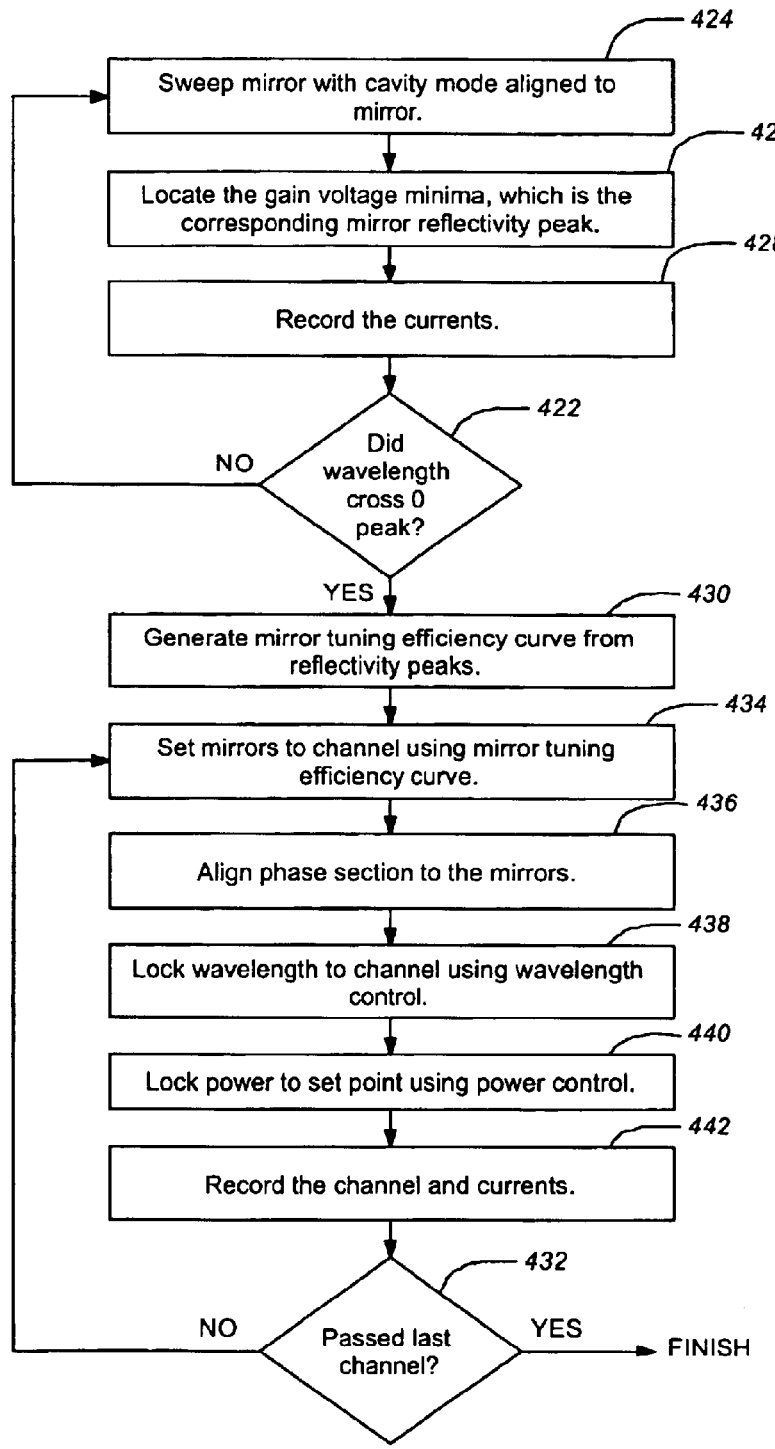

FIG. 4B is a flowchart of the mirror reflectivity peak calibration process. The process may begin with sweeping the mirror with the cavity mode aligned to the mirror at block 424. The gain voltage minima, which correspond to the mirror reflectivity peaks, are located at block 426. The currents corresponding to the minima are recorded at block 428. If the wavelength does not cross the 0 peak at block 422, the process returns to block 424 to continue sweeping the mirror. Otherwise, a mirror tuning efficiency curve is generated from the reflectivity peaks at block 430. Then at block 434 the mirrors are set to a channel using the mirror tuning efficiency curve. The phase section is aligned to the mirrors at block 436 and the wavelength is locked to the channel using wavelength control at block 438. Finally, the power is locked to the set point using the power control at block 440 and the channel and input currents are recorded at block 442. The process ends when the last channel has been located as checked at block 432.

The following pseudo-code also describes the logic of the mirror reflectivity peak calibration shown in FIG. 4B.

Until (wavelength crosses mirror reflectivity peak 0)
        Sweep mirror with cavity mode aligned to mirror
        Locate the gain voltage minima, which is the corresponding mirror reflectivity peak.
        Record the currents
    Generate mirror tuning efficiency curve from reflectivity peaks
    Until (step through all channels)
        Set mirrors to channel using mirror tuning efficiency curve
        Align phase section to the mirrors
        Lock wavelength to channel using wavelength control
        Lock power to set point using power control
        Record the channel and currents

2.2 Current Sources

Figure 5:
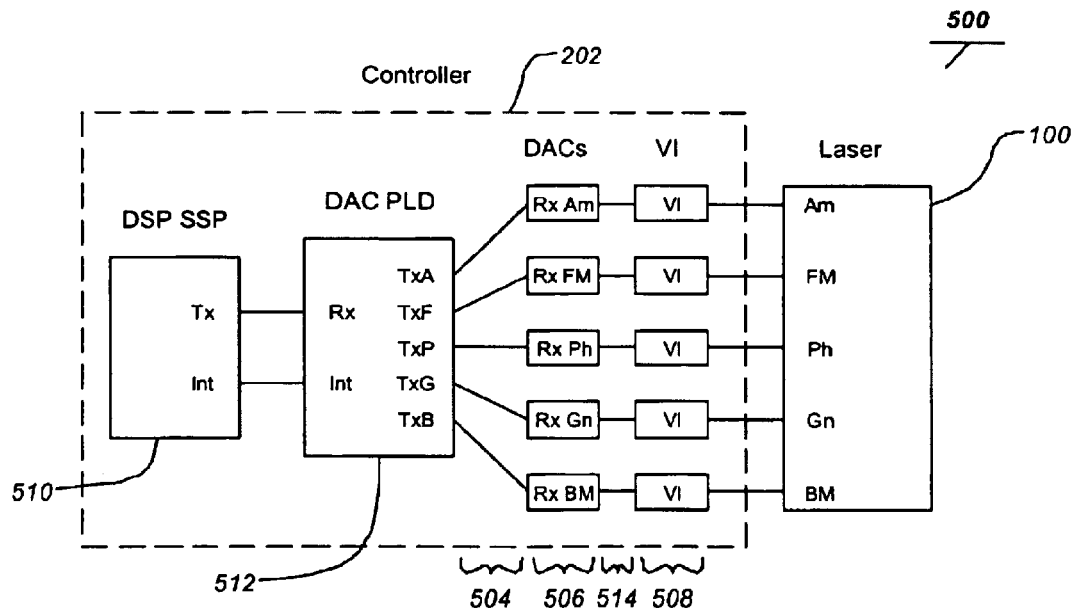
FIG. 5 is a block diagram of the current sources used in the controller.

FIG. 5 is a block diagram of the current sources 500 used in the controller 202. The Controller current sources 500 drive the phase, mirror, amplifier, and gain sections of the laser 100. The current sources are comprised of a voltage reference 504, individual 16-bit digital to analog converters 506 (DACs), and voltage to current (VI) amplifiers 508. The DACs 506 connect to the digital signal processor (DSP) synchronous serial port 510 (SSP) through a programmable logic device 512 (PLD). The PLD 512 provides a logic interface between the DSP SSP 510 and the DACs 506. The VI amplifiers 508 translate the DAC voltage outputs 514 to proportional current inputs 204 that drive the laser sections.

2.2.1 Voltage to Current Converter

Figure 6:
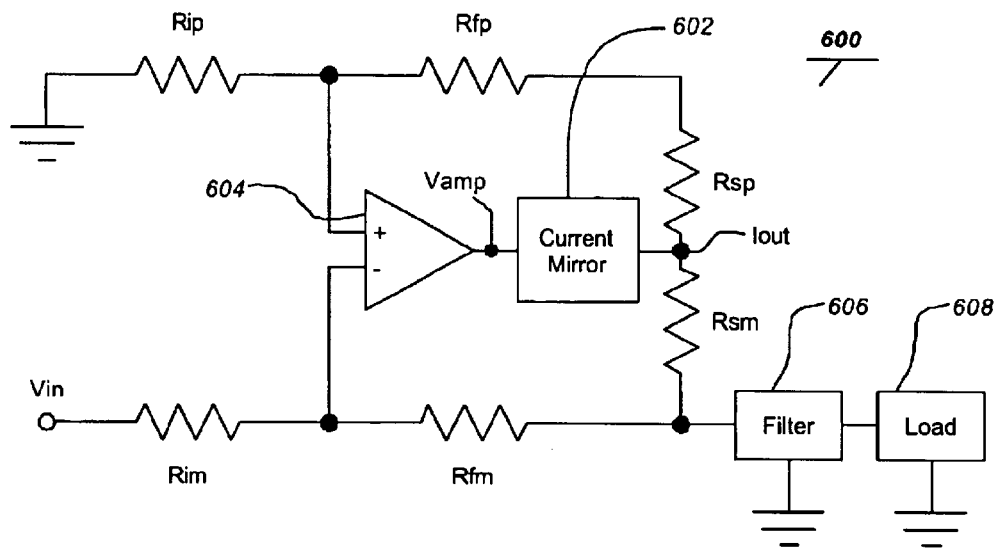
FIG. 6 illustrates a typical current source circuit of the present invention.

FIG. 6 illustrates a typical current source circuit 600 of the present invention. The voltage to current amplifier is a modified Howland circuit source (MHCS). A current mirror 602 is added to the output stage of the amplifier 604 to increase the drive current beyond that of the amplifier 604 alone. A filter stage 606 is added at the load 608 to reduce noise.

Figure 7:
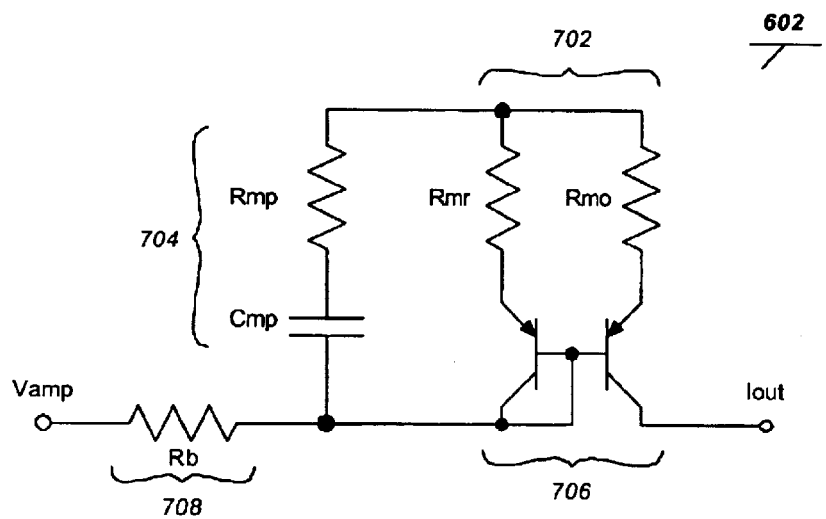
FIG. 7 illustrates a typical current mirror circuit of the present invention.

FIG. 7 illustrates a typical current mirror circuit 602 of the present invention. The current mirror inverts the output of the amplifier 604, which requires the source, Vin, at the inverting node of the amplifier 604 of the current source circuit 600.

The current mirror operates at a fixed gain that is determined, primarily, by the ratio of the resistors 702 in the emitter leads of the transistors. An RC compensation network 704 is added to insure stability of the amplifier and current mirror. The gain of the current is variable up to a maximum ratio. The maximum ratio is determined by the additional drift introduced by heating of the transistor 706 and sense resistor 708 and the maximum thermal loss that can be sustained by the transistor 706 and sense resistor 708. If additional gain is required, an additional Qmo and Rmo section can be added to the mirror 602.

3 Power and Wavelength Control

Figure 8A:
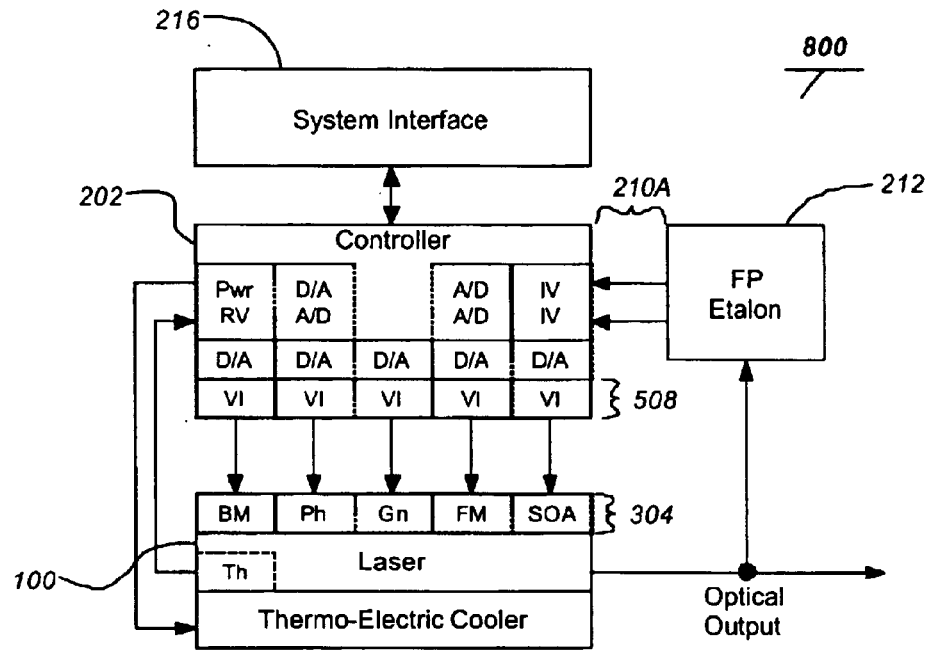
FIGS. 8A–8C illustrate a typical closed loop power and wavelength control system.
Figure 8B:
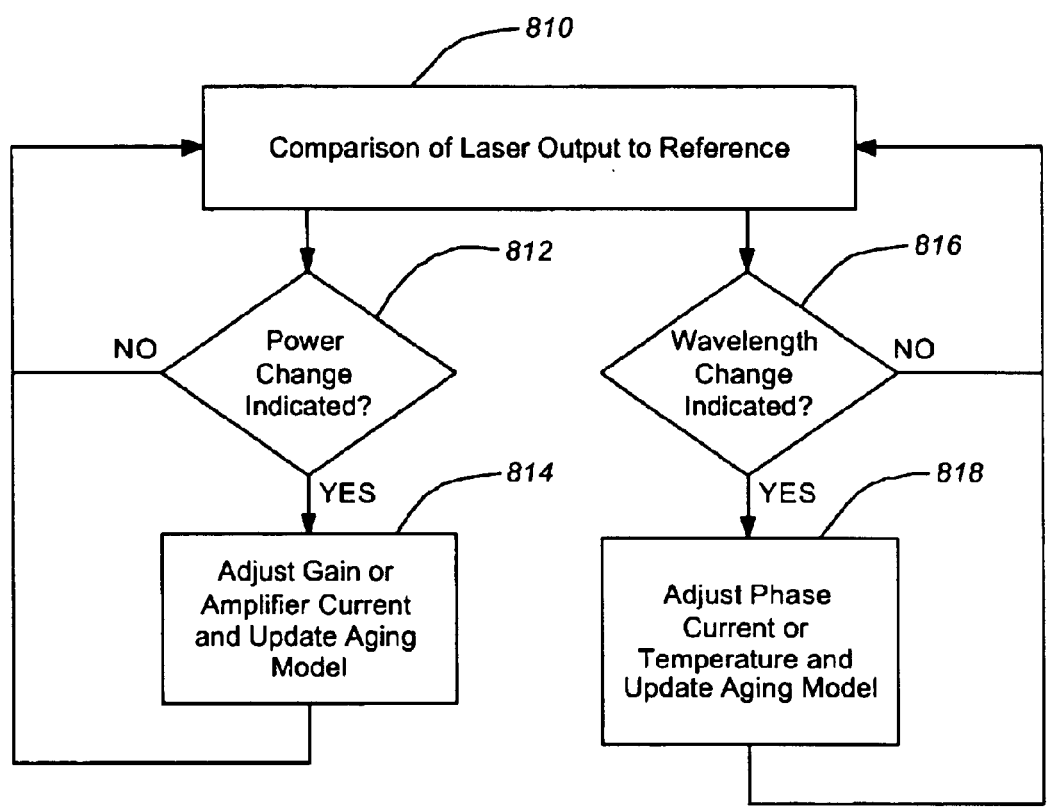
Figure 8C:
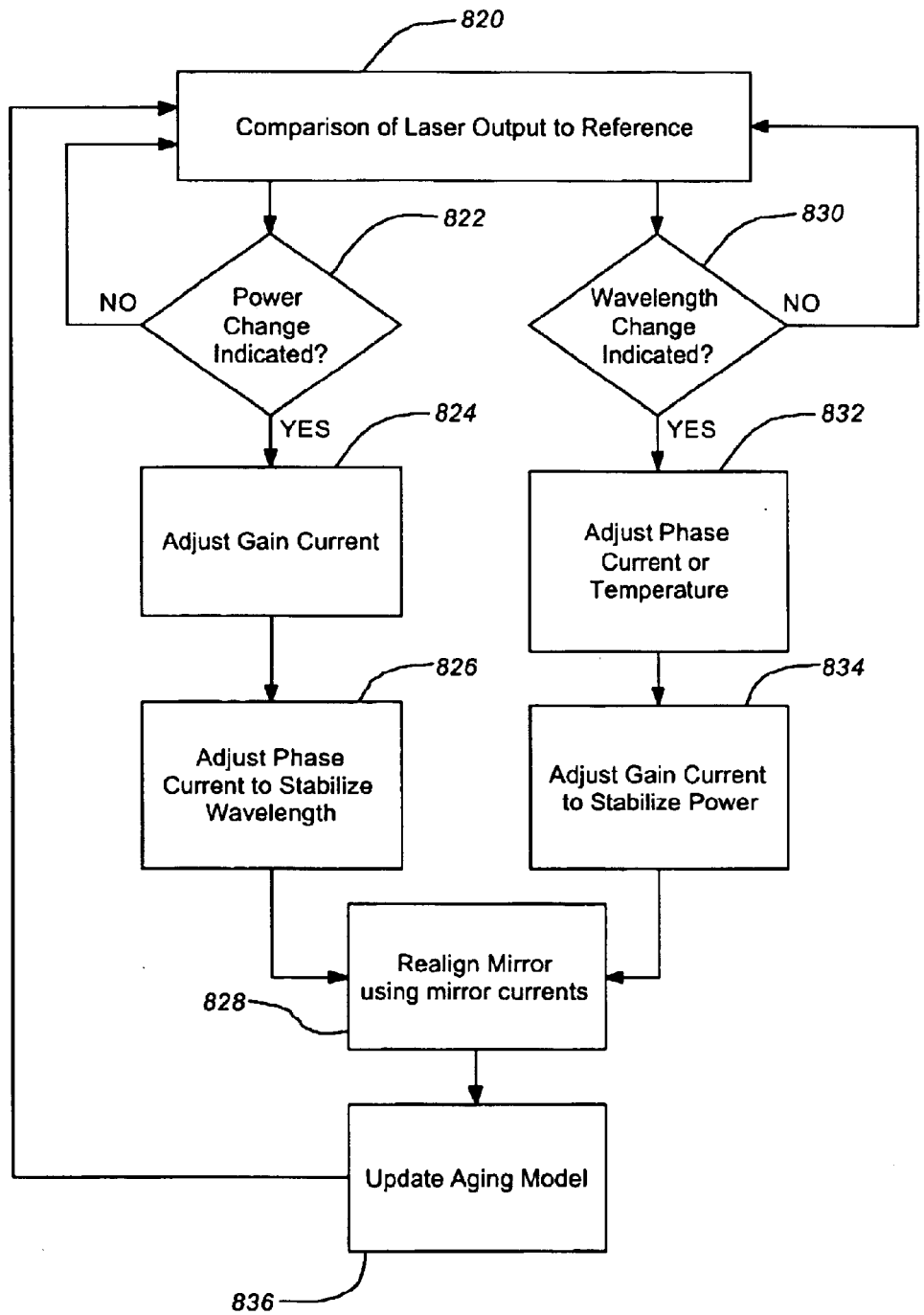

FIGS. 8A–8C illustrate a typical closed loop power and wavelength control system. FIG. 8A illustrates the control block diagram. Power and wavelength control 800 combines open loop control (as shown in FIG. 3) and feedback 210A from an external wavelength locker (e.g., a Fabry-Perot Etalon) reference 212 to lock the laser optical output power and wavelength to the reference 212. Power and wavelength control compensates for drift in the controller current sources 508 and the laser operating points over time and temperature.

Once new currents to the various sections 304 are established by locking to the external wavelength reference 212 for a given channel, the aging model or lookup table can be updated so that the system is adapted to small changes in device characteristics as it ages. Also, by using a formula based upon the initial calibration characteristics, the currents for the other desired operating powers and wavelength channels stored in the aging model can be adjusted as well. For example, the currents for each section at any other channel are adjusted in proportion to the change in that section current at the operating channel.

$$dIgain = Igain, \text{change}/Igain, \text{calibration [at operating channel]}$$

$$\text{change} = (Igain, \text{calibration} + dIgain*Igain, \text{calibration [at any other channel]}$$

This is done for each section current. This insures that desired operating channels can always be accessed over the device's lifetime. The power and wavelength controls may each operate independently or interdependently with other laser inputs.

3.1 Independent

FIG. 8B is a flow diagram of independent control of the power and wavelength. The least complex control algorithm is where the controls operate independently. Each control algorithm induces changes in one laser input, such as a current or temperature, independent of the other laser inputs. The control algorithms are classical proportional, integral control routines. The laser output is compared to the reference to identify whether a change in optical power and/or optical wavelength is indicated at block 810. If a change in the optical power is indicated at block 812, the optical power is adjusted by the gain current (Ign) or by the current to a SOA (if integrated into the Laser) at block 814. If a change in the optical wavelength is indicated at block 814, optical wavelength is adjusted by the phase current (Iph) or the submount temperature at block 818. Of course, the order of the power or wavelength adjustment is unimportant. In addition, the aging model may be updated whenever a change (in power or wavelength) is indicated. Mirror currents are left fixed.

3.2 Interdependent

FIG. 8C is a flow diagram of interdependent control of the power and wavelength. The independent control algorithm is slow and marginally stable in its response to changes in the optical power output and optical wavelength. The mirrors and cavity mode become misaligned as the control algorithm adjusts the gain and phase currents from their predefined values. The quality of the optical output is reduced (decreased side mode suppression ratio) and the probability of a mode hop is increased (wavelength shift) as the mirrors and cavity mode become misaligned.

The interdependent control algorithm induces primary changes in one laser input, such as a current or temperature, and corrects for secondary changes in at least one other laser input with an adaptive filter or estimator. This compensates for wavelength shifts or power changes and mirror misalignment induced when the control adjusts its primary variable. Here also, the laser output is compared to the reference to identify whether a change in optical power and/or optical wavelength is indicated at block 820. If a change in the optical power is indicated at block 822, the power is adjusted by the gain current (Ign) at block 824 and the wavelength is stabilized by adjusting the phase current (Iph) by an adaptive filter at block 826. The mirror currents are realigned by a fixed estimator at block 828. Following this, the aging model is updated at block 836. If a change in the optical wavelength is indicated at block 830, wavelength is adjusted by the phase current (Iph) or the carrier temperature at block 832. The power is stabilized by adjusting the gain current (Ign) by an adaptive filter at block 834. and the mirror currents are realigned by a fixed estimator at block 828. Here too, the aging model is updated at block 836.

The interdependent controls provide more robust, stable, and faster convergence of the power and wavelength to its reference value.

As outlined above, the aging model is then updated to reflect the new model coefficients whereby the currents from the aging model or look-up table are adjusted for a given desired wavelength and power. Also, the changes required for this particular channel can be used to estimate the changes required for all other channels.

4.0 Gain Voltage Control

Gain Voltage Control uses feedback from the Laser gain section voltage to keep the mirrors aligned with the cavity mode. It aligns the mirrors by minimizing the Laser gain section voltage. The Laser gain section voltage minimum is where the cavity loss is a minimum. It corresponds to maximum optical power output, wavelength stability, and side mode suppression ratio.

Gain voltage control is implemented in the DSP using a numerical minima search or a least mean squares (LMS) quadratic estimator or in analog circuitry using a phase locker (PL) circuit.

4.1 DSP Gain Voltage Control

Figure 9:
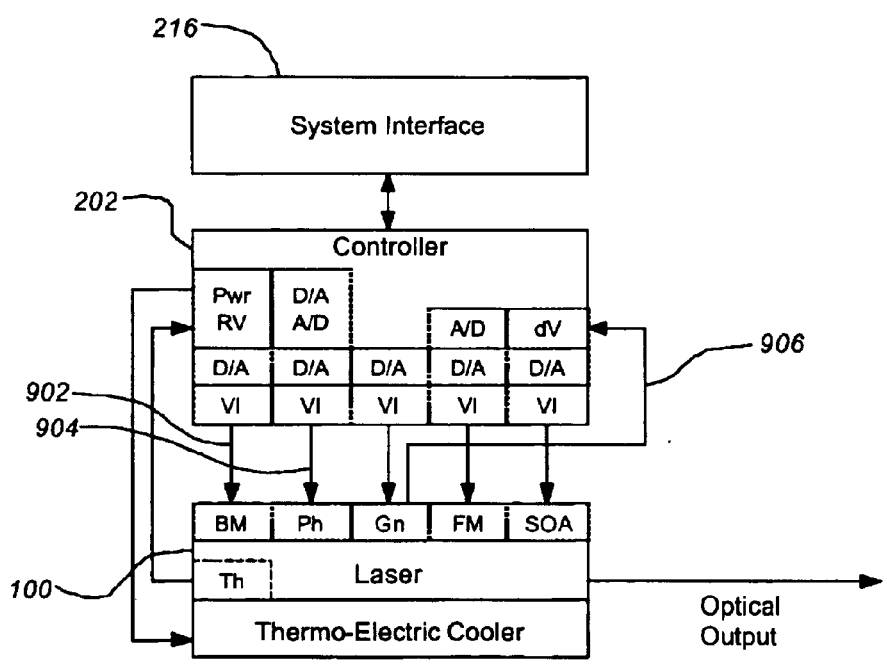
FIG. 9 illustrates the DSP gain voltage control block diagram.

FIG. 9 illustrates the DSP gain voltage control block diagram. The DSP dithers the Laser mirror currents 902, 904 and monitors the Laser gain section voltage 906. It uses a numerical algorithm to align the mirrors by locating the minima of the Laser gain section voltage.

4.1.1 DSP Minima Search Algorithm

The minima search algorithm uses three data points (mirror current, gain voltage) and estimates the slope of the gain voltage curve with respect to the mirror current. The algorithm steps towards the gain voltage minima and calculates the next data point and uses the new data point and the two best points to re-estimate the slope of the gain voltage curve. The algorithm continues the above step process, continually searching for the gain voltage minima.

4.1.2 DSP LMS Estimator

The minima search algorithm is susceptible to wandering around the gain voltage minima due to noise in the sampled gain voltage signal. The wandering is reflected as drift and noise on the optical signal. The LMS estimator reduces the wander and noise by using an array of data points to estimate the gain voltage surface, in effect, filtering the noise. The LMS estimator converges to the gain voltage minima faster and smoother than the minima search.

For fixed phase and gain section currents, the gain section voltage can be modeled using a causal Volterra series expansion over 2 input signals, the front mirror and back mirror currents. For dithering signals in the sub-100 kHz regime, the analog circuitry and the device itself allow a memoryless model, so a 5-tap adaptive quadratic filter model will suffice.

The LMS estimator can then be achieved using either of two classic adaptive filter update algorithms, a standard gradient descent adaptation (LMS or block LMS algorithm) or a (faster) recursive least squares adaptation (RLS algorithm—based on Newton's Method).

The second approach is used to achieve faster convergence of adaptive linear filters when the signals driving the system do not have sufficient spectral flatness to allow a rapid gradient descent. However, in the case of adaptive linear filters, the gradient descent approach converges just as fast as the RLS approach when white noise can be used to drive the system. Recently published results indicate that comparable rates of convergence can be achieved with adaptive quadratic filters if a minor filter structure modification is used and (pseudo) Gaussian white noise can be used to drive the system.

There are two advantages of this LMS estimator approach. First, an initial tap-vector can be stored along with the 4 drive currents in the laser calibration table in flash memory (resulting in much faster convergence). Second, the adaptation step size can be reduced as the system converges, reducing steady-state misadjustment in the mirror section currents.

4.2 Analog Gain Voltage Control

Figure 10:
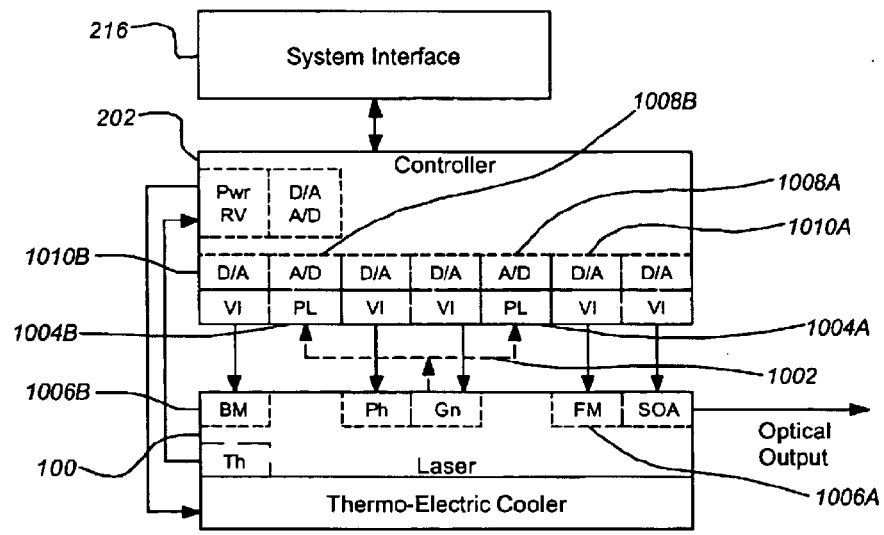
FIG. 10 illustrates the analog gain voltage control block diagram.

FIG. 10 illustrates the analog gain voltage control block diagram. The gain voltage 1002 is connected to analog phase lockers (PL) 1004A, 1004B for each mirror section 1006A, 1006B. The digital algorithms are limited in speed and accuracy by the analog to digital converters (ADC or A/D) 1008A, 1008B and digital to analog converters (DAC or D/A) 1010A, 1010B as well as the signal to noise ratio (SNR) of the circuit. The analog phase locker's speed and accuracy is limited by the SNR of the circuit.

Figure 11:
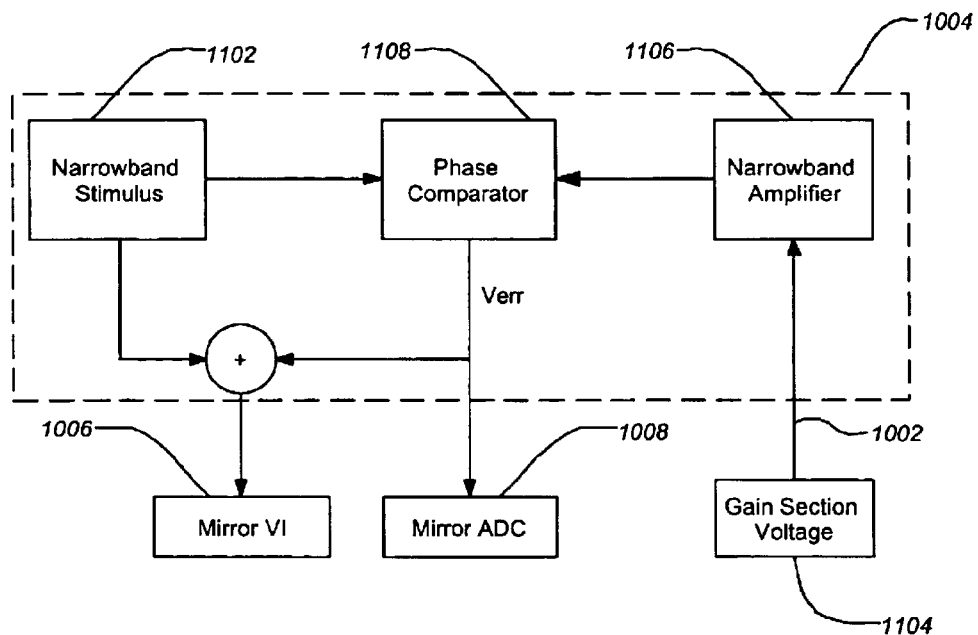
FIG. 11 illustrates the analog phase lock circuit block diagram.

FIG. 11 illustrates the analog phase lock circuit block diagram 1100. The analog phase locker is a high speed, analog-locking loop. It is realized by a phase lock loop (PLL) or RF dither locker. The PL works with the open loop control circuit. The output of the PL adds to the output of the open loop control current sources.

The PL uses a high frequency narrowband stimulus 1102 to dither the mirror current. The gain voltage (Vg) 1104 is measured with a tuned, narrowband amplifier 1106. The phase difference between stimulus and measured signal is extracted by a phase comparator 1108 and drives an error amplifier that adjusts the mirror 1110 current to the gain voltage minima and is sampled by an ADC 1112.

The PL error amplifier output is measured by the DSP. The DSP adjusts the mirror current values in the Open Loop Control aging model to reduce the error to zero. The DSP effectively operates as an integrator function.

Figure 12:
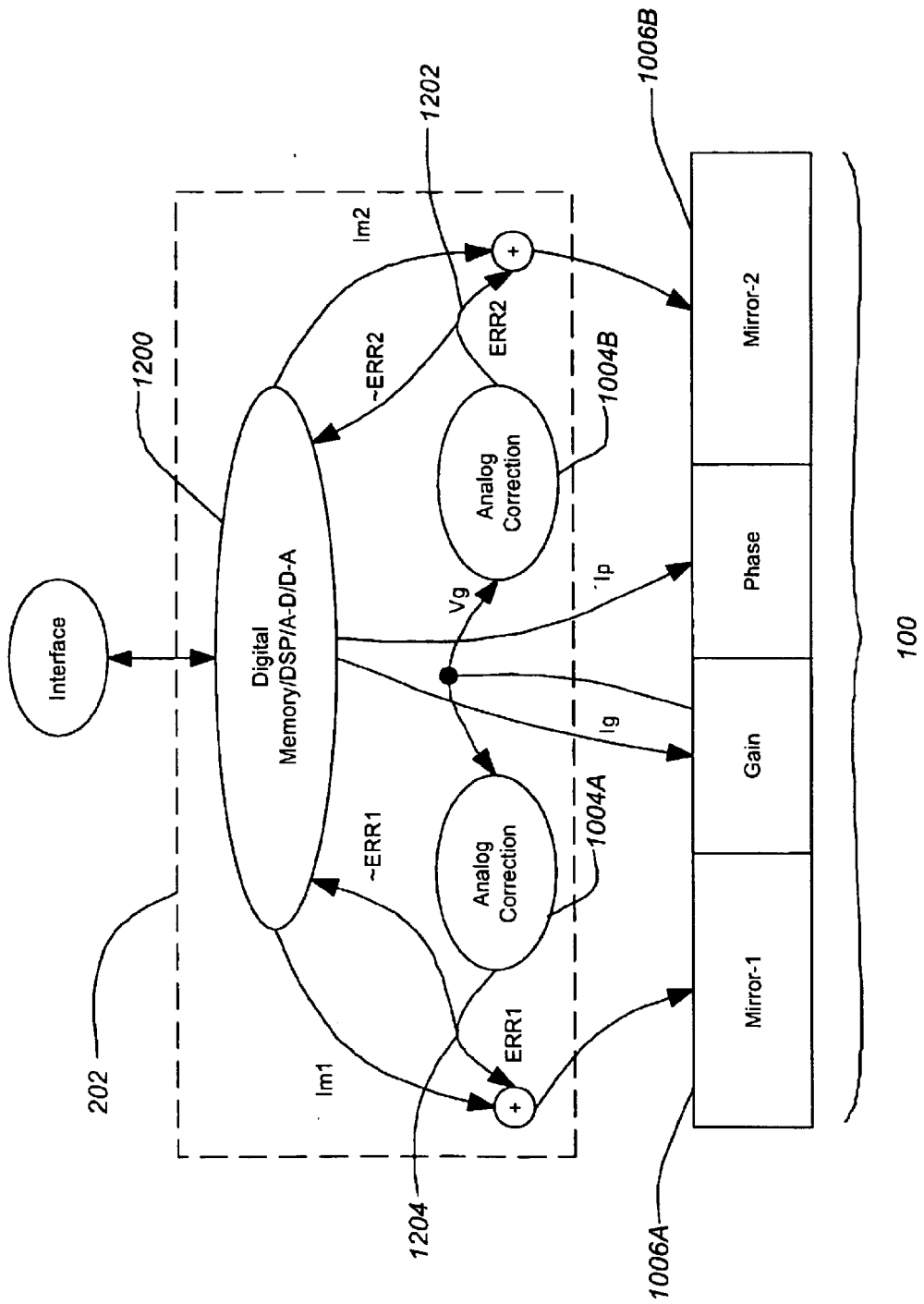
FIG. 12 illustrates the combined operation of analog gain voltage control circuits to correct the outputs to the two mirrors from the open loop digital controller.

FIG. 12 illustrates the combined operation of analog gain voltage control circuits to correct the outputs to the two mirrors from the open loop digital controller. The digital memory/DSP 1200 can set a first approximation current and voltage from a table look up. The analog correction circuits 1004A, 1004B can provide feedback and correction signals to the device as described previously, and the digital controller then monitors the correction signals 1202, 1204 and readjusts the currents and voltages to have the feedback currents from the analog correction portions approach zero. The adjusted currents are used by the aging model to update the aging coefficients. This allows for correction of the laser controller over the life of the SGDBR laser, and accounts for changes in operating temperatures and conditions as well as changes in the operation of the SGDBR laser internal components.

5 Power, Wavelength, and Gain Voltage Control

Power, wavelength, and gain voltage control operates the power and wavelength control and gain voltage control simultaneously.

6 Conclusion

The foregoing description of the preferred embodiment of the invention has been presented for the purposes of illustration and description. It is not intended to be exhaustive or to limit the invention to the precise form disclosed. Many modifications and variations are possible in light of the above teaching. It is not intended that the scope of the invention be limited by this detailed description.

This concludes the description of the preferred embodiment of the present invention. The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An open loop controller for a sampled granting distributed Bragg reflector (SGDBR) laser, comprising:
    a look up table of current settings stored in the controller, each entry in the table corresponding to an optical power and wavelength of the SGDBR laser, each entry in the look up table comprising:
        a first mirror current setting for a first mirror section of the SGDBR laser;
        a second mirror current setting for a second mirror section the SGDBR laser;
        a phase current setting for a phase section of the SGDBR laser; and
        a gain current setting for a gain section of the SGDBR laser,
    the first mirror current seating, second mirror current setting, phase current setting, and gain current setting controlling at least one of a group comprising an optical output power and an output wavelength of the SGDBR laser; and
    a processor, given a selected optical power and output wavelength, said processor selecting an entry from the look up table and applying the first mirror current setting, the second mirror current setting, the phase current setting and the gain current setting to current sources coupled respectively to the first mirror section, second mirror section, the phase section and the gain section of the SGDBR laser, to control the laser at substantially the selected optical power and output wavelength;
    wherein the SGDBR laser comprises a cavity including the phase section and the gain section and bounded by the first mirror section and the second mirror section.

2. The controller of claim 1, further composing a temperature regulator sensing and controlling a temperature of the SGDBR laser by monitoring a temperature sensor of the SGDBR laser and adjusting the current to a thermoelectric cooler.

3. The controller of claim 2, wherein the temperature regulator regulates the temperature of the SGDBR laser to a fixed, pre-selected temperature.

4. The controller of claim 1, wherein the lookup table comprises unique values for a specific SGDBR laser being controlled.

5. The controller of claim 4, wherein the unique values of the lookup table are determined using a calibration routine.

6. The controller of claim 1 wherein each entry in the look up table further comprises an optical amplifier current setting.

7. The controller of claim 6 wherein the optical output powers adjusted by the optical amplifier current setting.

8. The controller of claim 5, wherein the calibration routine comprises an incremental calibration routine wherein the SGDBR laser is stepped and locked to each channel using a calibrated wavelength locker as a reference.

9. The controller of claim 5, wherein the calibration routine comprise a mirror reflectively peak calibration routine where reflectivity peaks of the first mirror and the second mirror are determined, mirror timing efficiency curves are generated front the reflectively peaks and the first mirror tuning strung and the second mirror current setting for each entry in the look up table are determined from the mirror timing efficiency curves.

10. The controller of claim 9, wherein minima of a gain voltage measurement of the SGDBR laser is used to determine the reflectivity peaks.

11. The controller of claim 1, wherein the process comprises a digital signal processor (DSP) for applying the current settings of the lookup table to operate the SGDBR laser.

12. The controller of claim 11, wherein the current sources comprises a current source for each of the current settings, each current source including a digital to analog converter (DAC) coupled to a voltage to current amplifier (VI) where each current source is coupled to the DSP for applying the current settings of the lookup table to operate the SGDBR laser.

13. The controller of claim 12, further comprising a programmable logic device (PLD) providing an interface between the DSP and each current source.

14. The controller of claim 12, wherein the voltage to current amplifier comprises a modified Howland circuit.

15. The controller of claim 14, wherein the voltage to current amplifier further comprises a current mirror added to an amplifier output of the modified Howland circuit.

16. The controller of claim 15, wherein the voltage to current amplifier further comprises a fixer to reduce noise.

* * * * *

UNITED STATES PATENT AND TRADEMARK OFFICE
CERTIFICATE OF CORRECTION

PATENT NO. : 6,788,719 B2
DATED : September 7, 2004
INVENTOR(S) : Paul F. Crowder It is certified that error appears in the above-identified patent and that said Letters Patent is hereby corrected as shown below:

Title page,
Item [56], References Cited, OTHER PUBLICATIONS, "Sarlet, G. et al.," reference, after "vol. 11," insert -- No. 11 --.

Column 11,
Line 47, "granting" should read -- grating --.
Line 56, after "section" insert -- of --.

Column 12,
Line 35, "comprise" should read -- comprises --, "reflectively" should read -- reflectivity --.
Line 37, "timing" should read -- tuning --.
Line 38, "front" should read -- from --, "reflectively" should read -- reflectivity --.
Line 39, "tuning strung" should read -- current setting --.
Line 41, "timing" should read -- tuning --.
Line 45, "process" should read -- processor --.
Line 50, "comprises" should read -- comprise --.
Line 65, "fixer" should read -- filter --.

Signed and Sealed this

First Day of March, 2005

JON W. DUDAS
*Director of the United States Patent and Trademark Office*